(12) United States Patent  
Wu et al.

(10) Patent No.: US 10,204,991 B2  
(45) Date of Patent: Feb. 12, 2019

(54) TRANSISTOR STRUCTURES AND FABRICATION METHODS THEREOF

(71) Applicant: GLOBALFOUNDRIES Inc., Grand Cayman (KY)

(72) Inventors: Xusheng Wu, Ballston Lake, NY (US); Jin Ping Liu, Ballston Lake, NY (US); Min-hwa Chi, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/482,086

(22) Filed: Apr. 7, 2017

(65) Prior Publication Data

US 2017/0213890 A1   Jul. 27, 2017

Related U.S. Application Data

(62) Division of application No. 14/526,831, filed on Oct. 29, 2014, now Pat. No. 9,647,073.

(51) Int. Cl.

| | |
|---|---|
| *H01L 29/165* | (2006.01) |
| *H01L 29/78* | (2006.01) |
| *H01L 29/737* | (2006.01) |
| *H01L 29/08* | (2006.01) |
| *H01L 29/66* | (2006.01) |

(Continued)

(52) U.S. Cl.

CPC ...... *H01L 29/165* (2013.01); *H01L 21/26506* (2013.01); *H01L 29/0821* (2013.01); *H01L 29/0847* (2013.01); *H01L 29/6625* (2013.01); *H01L 29/66242* (2013.01); *H01L 29/66272* (2013.01); *H01L 29/66636* (2013.01); *H01L 29/732* (2013.01); *H01L 29/737* (2013.01); *H01L 29/7371* (2013.01); *H01L 29/7848* (2013.01)

(58) Field of Classification Search

CPC ............ H01L 29/165; H01L 21/26506; H01L 29/0847; H01L 29/6625; H01L 29/66636; H01L 29/737; H01L 29/7848; H01L 29/6642; H01L 29/66272

USPC ........................................ 257/190, 288, 408

See application file for complete search history.

(56) References Cited

U.S. PATENT DOCUMENTS

| | | | | |
|---|---|---|---|---|
| 4,199,774 A | * | 4/1980 | Plummer | ............... H01L 27/088 257/124 |
| 2008/0006818 A1 | | 1/2008 | Luo et al. | |
| 2008/0067557 A1 | | 3/2008 | Yu et al. | |

(Continued)

*Primary Examiner* — Dzung Tran (74) *Attorney, Agent, or Firm* — Heslin Rothenberg Farley & Mesiti P.C.; Jacquelyn A. Graff (57) ABSTRACT

Transistor structures and methods of fabricating transistor structures are provided. The methods include: fabricating a transistor structure at least partially within a substrate, the fabricating including: providing a cavity within the substrate; and forming a first portion and a second portion of the transistor structure at least partially within the cavity, the first portion being disposed at least partially between the substrate and the second portion, where the first portion inhibits diffusion of material from the second portion into the substrate. In one embodiment, the transistor structure is a field-effect transistor structure, and the first portion and the second portion include one of a source region or a drain region of the field-effect transistor structure. In another embodiment, the transistor structure is a bipolar junction transistor structure.

11 Claims, 5 Drawing Sheets

(51) Int. Cl.
*H01L 21/265* (2006.01)
*H01L 29/732* (2006.01)

(56) References Cited

U.S. PATENT DOCUMENTS

| | | |
|---|---|---|
| 2009/0230480 A1 | 9/2009 | Shifren et al. |
| 2010/0090289 A1 | 4/2010 | Yang et al. |
| 2011/0260213 A1 | 10/2011 | Chan et al. |
| 2012/0001254 A1 | 1/2012 | Kronholz et al. |
| 2012/0181625 A1 | 7/2012 | Kwok et al. |

* cited by examiner

TRANSISTOR STRUCTURES AND FABRICATION METHODS THEREOF

CROSS-REFERENCE TO RELATED APPLICATION

This application is a divisional of U.S. application Ser. No. 14/526,831 filed Oct. 29, 2014, which is hereby incorporated herein by reference in its entirety.

FIELD OF THE INVENTION

The present invention relates to semiconductor devices, and more particularly to transistor structures and fabrication methods thereof.

BACKGROUND OF THE INVENTION

Over the past several decades, in order to meet consumer demand, the semiconductor industry has pursued increased density and enhanced performance of integrated circuits, such as memory devices and microprocessors. As critical dimensions of semiconductor devices continue to decrease, one of many challenges facing the industry has been the fabrication of devices, such as transistors, with highly activated or doped and/or ultra shallow regions. However, techniques to achieve such regions have not scaled well at the required critical dimensions, leading to degraded device performance.

BRIEF SUMMARY

The shortcomings of the prior art are overcome, and additional advantages are provided, through the provision, in one aspect, of a method of fabricating a transistor structure at least partially within a substrate. The fabricating includes providing a cavity within the substrate; and forming a first portion and a second portion of the transistor structure at least partially within the cavity, the first portion being disposed at least partially between the substrate and the second portion, where the first portion inhibits diffusion of material from the second portion into the substrate.

In another aspect, a transistor structure is presented. The transistor structure includes a first portion and a second portion disposed at least partially within a substrate, the first portion being disposed at least partially between the substrate and the second portion, where the first portion inhibits diffusion of material from the second portion into the substrate.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

Disclosed herein, at least in part, are structures and fabrication methods that allow for the formation of highly activated and ultra-shallow regions for semiconductor devices, such as transistors, with reduced critical dimensions. For example, a critical dimension may be the minimum metal line width of a semiconductor device. During semiconductor device fabrication processing, dopants may undesirably diffuse or migrate from highly activated regions to other regions of the semiconductor device. In addition, techniques to form highly activated regions may also introduce physical damage or defects to the other regions of the semiconductor device. Therefore, such techniques can adversely impact device performance. Such problems are more pronounced as critical dimensions continue to shrink, because, for example, dopants may more easily diffuse over shorter distances.

For instance, if dopants unpredictably migrate from source regions or drain regions to channel regions of field-effect transistors, the threshold voltages of the transistors may change unpredictably. This could lead to variability of threshold voltages among the transistors of a circuit, such as a random access memory circuit, potentially rendering the circuit inoperable, because such circuits are sensitive to threshold voltage mismatch. In addition, if source regions or drain regions are formed in a cavity of a field-effect transistor in order to apply a stress to the channel regions thereof, physical damage close to a junction may lead to strain relaxation, eliminating, at least in part, the stress applied by the source regions or drain regions. Such reduction of stress can lead to a reduced current capacity, and consequently speed, of the transistor.

Generally stated, provided herein, in one aspect, is a method of fabricating a transistor structure at least partially within a substrate. The fabricating includes: providing a cavity within the substrate; and forming a first portion and a second portion of the transistor structure at least partially within the cavity, the first portion being disposed at least partially between the substrate and the second portion, where the first portion inhibits diffusion of material from the second portion into the substrate. In such a case, in one example, the forming includes using a single epitaxial growth step in forming the first portion and the second portion of the transistor structure. In another example, the method further includes annealing the transistor structure, where the first portion inhibits diffusion of material from the second portion into the substrate notwithstanding the annealing.

In one embodiment, the forming includes: providing the first portion with first impurities and the second portion with second impurities, wherein the first impurities of the first portion inhibit diffusion of the second impurities of the second portion into the substrate. In such a case, in one example, the first impurities include one or more of carbon atoms or fluorine atoms. In another example, the second impurities include p-type impurities. In a further example, the forming includes: growing the first portion and the second portion of the transistor structure from a common semiconductor material; and introducing, during the growing, the first impurities into the first portion and the second impurities into the second portion.

In another embodiment, the first portion comprises a material selected and configured to inhibit strain relaxation of material of the second portion. In a further embodiment, the first portion and the second portion both apply stress to the substrate.

In one implementation, the first portion and the second portion include one semiconductor material, and the substrate includes another semiconductor material, the one semiconductor material and the other semiconductor material being different semiconductor materials with different lattice constants.

In another implementation, the transistor structure includes a field-effect transistor structure, and the first portion and the second portion include one of a source region or a drain region of the field-effect transistor structure, and the fabricating further includes: forming a channel region of the field-effect transistor structure at least partially within the substrate and adjacent to the one of a source region or a drain region thereof, where the first portion inhibits diffusion of the material from the second portion to the channel region.

In a further implementation, the transistor structure is or includes a bipolar junction transistor structure, the first portion including a base region and the second portion including an emitter portion thereof, and the fabricating further includes: forming a collector region of the bipolar junction transistor structure at least partially within the substrate and adjacent to the base region thereof, where the first portion inhibits diffusion of the material from the second portion to the collector region.

In another aspect, a transistor structure is presented. The transistor structure includes a first portion and a second portion disposed at least partially within a substrate, the first portion being disposed at least partially between the substrate and the second portion, where the first portion inhibits diffusion of material from the second portion into the substrate. In such a case, in one embodiment, the first portion includes first impurities and the second portion includes second impurities, and the first impurities of the first portion inhibit diffusion of the second impurities of the second portion into the substrate.

Reference is made below to the drawings, which are not drawn to scale for ease of understanding, wherein the same reference numbers used throughout different figures designate the same or similar components.

Figure 1A:
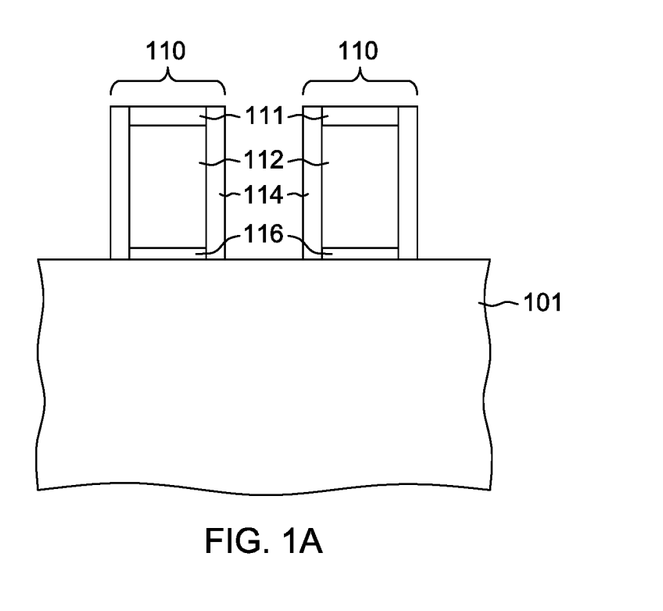
FIG. 1A is a cross-sectional elevational view of a structure obtained in a transistor structure fabrication process, in accordance with one or more aspects of the present invention.

FIG. 1A is a cross-sectional elevational view of a structure obtained in a transistor structure fabrication process, in accordance with one or more aspects of the present invention. As illustrated, the structure includes a substrate 101, such as a semiconductor substrate, and multiple gate structures 110 disposed above substrate 101. In one embodiment, gate structures 110 can be used in a self-aligned source region and drain region formation process for field-effect transistors, as described with respect to FIGS. 1A-1D.

Gate structures 110 include a gate fill material 112 bounded by spacers 114, and/or gate hard mask cap 111. Gate fill material 112 is disposed over a gate oxide 116. In one example, in a gate last or replacement metal gate process, gate fill material 112 may be a sacrificial gate material, such as polycrystalline silicon, which is removed and replaced with a conductive or metal gate, which may include one or more layers of conductive material, such as work function metals, in a later process. In another example, in a gate first process, gate fill material 112 may be a conductive or metal gate, including one or more portions, such as one or more layers of conductive materials.

Gate structures 110 may be formed using any suitable deposition process, such as atomic layer deposition (ALD), chemical vapor deposition (CVD), or physical vapor deposition (PVD). In one example, gate oxide 116 may be provided in a blanket deposition over a large portion of the substrate. In another example, gate oxide 116 may be selectively deposited only in some portions, such as portions of the substrate intended to support field-effect transistors. Various materials may be used to form layers of the gate structures, such as titanium nitride, tantalum nitride, aluminum, etc.

In one embodiment, substrate 101 may be p-type doped (a p-well) or n-type doped (an n-well). In another embodiment, substrate 101 may include multiple fin structures, formed by removing one or more portions of the substrate, leaving behind multiple fins structures extending from the substrate. Formation of multiple fin structures may be achieved using various techniques, including direct lithography, double patterning such as sidewall image transfer technique, extreme ultraviolet lithography (EUV), electron beam lithography, etching, or combinations thereof. In such a case, gate structures 110 may be conformal structures overlying the fin structures, wrapping around the fin structures on three exposed sides, facilitating the use of the body of the fin structures as channels for the field-effect transistor.

In another embodiment, substrate 101 may be or include any silicon-containing substrate material including, but not limited to, single crystal Si, polycrystalline Si, amorphous Si, Si-on-nothing (SON), Si-on-insulator (SOI), or Si-on-replacement insulator (SRI) substrates. In other examples, the substrate may be or include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb) or combinations thereof, or an alloy semiconductor such as GaAsP, AlInAs, GaInAs, GaInP, or GaInAsP or combinations thereof. In further examples, the substrate may be an n-type or p-type doped semiconductor material.

Figure 1B:
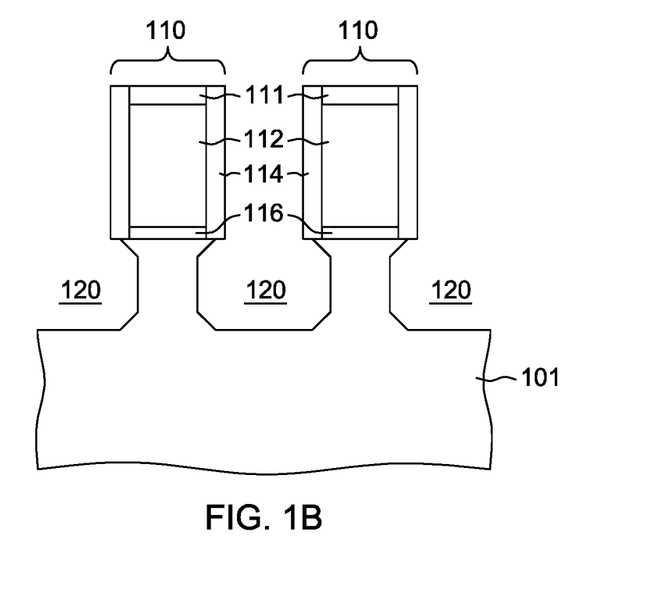
FIG. 1B is a cross-sectional elevational view of the structure of FIG. 1A after providing a cavity within a substrate thereof, in accordance with one or more aspects of the present invention.

FIG. 1B is a cross-sectional elevational view of the structure of FIG. 1A after providing a cavity 120 within substrate 101, in accordance with one or more aspects of the present invention. For instance, in one embodiment, cavities 120 are formed to facilitate fabrication of source regions and drain regions for field-effect transistors. In addition, one or more processes of isotropic and/or anisotropic etching can be used to form cavities 120. In one embodiment, gate structures 110 help define the position of cavities 120, because the etching is chosen to only etch the material of substrate 101 and not the material of gate structures 110. In such an embodiment, the cavities can be self aligned adjacent to the gate structures because the gate structures are a mask for the cavity etching process.

In the example illustrated in FIG. 1B, after etching substrate 101 to form cavities 120, various crystallographic planes of substrate 101 can be exposed. The cavities may be referred to as sigma-cavities, so named for the resemblance between the Greek-letter Σ (sigma) and the profile of their angular planes, such as {111}, {110}, and {100} planes. The symbol {xyz} denotes the Miller index for the set of equivalent crystal planes. In other examples, the cavity shape may be U shaped, round shaped, ball shaped, or other shapes depending on the etch processes used, such as one or more steps of dry and wet etching.

In one embodiment, one or more etching processes may be used to form cavities 120. For example, any of the following etching technologies may be used: reactive ion etching (RIE), plasma etching, dry etching, or wet etching, using one or more of tetrafluoromethane (CF$_4$), sulfur hexafluoride (SF$_6$), boron chloride, (BCl$_3$), nitrogentrifluoride (NF$_3$), potassium hydroxide (KOH), or tetra-methyl-ammonium hydroxide (TMAH). In another example, ammonia hydroxide (NH$_4$OH) etching may be used, because it may preferentially etch along specific crystal planes of substrate 101, thereby defining surfaces with distinct crystallographic orientation.

Figure 1C:
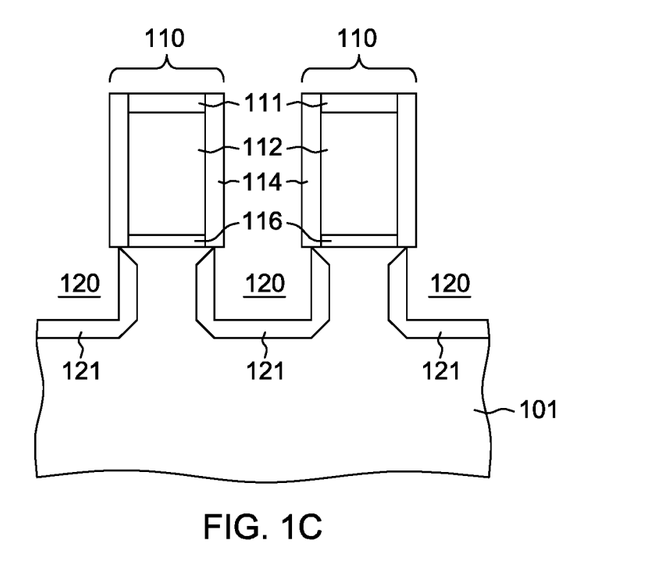
FIG. 1C is a cross-sectional elevational view of the structure of FIG. 1B after forming a first portion of the transistor structure at least partially within the cavity thereof, in accordance with one or more aspects of the present invention.

FIG. 1C is a cross-sectional elevational view of the structure of FIG. 1B after forming a first portion 121 of the transistor structure at least partially within cavity 120 thereof, in accordance with one or more aspects of the present invention. In the illustrated embodiment, first portion 121 can inhibit diffusion of material into substrate 101, in particular from any later formed structures within cavity 120.

In one embodiment, first portion 121 is a semiconductor material, such as silicon or silicon germanium, and includes impurities such as carbon atoms and/or fluorine atoms. Advantageously, silicon germanium with carbon and/or fluorine can be used to inhibit diffusion of various materials, such as boron, phosphorous, arsenic or other dopants. In one embodiment, dopant diffusion can be reduced when carbon is co-implanted with boron into a silicon substrate. For example, this reduction can be due to implanted carbon providing a sink for excess interstitials (such as boron or phosphorous) during annealing, thereby preventing diffusion of such materials into, e.g., the substrate. In another embodiment, the present techniques allow control of boron and phosphorus transient enhanced diffusion (TED), advantageously facilitating the development of high performance n-type and p-type ultra shallow junctions. In another embodiment, a first portion of a transistor structure including carbon and/or fluorine (e.g., co-implanted carbon and/or fluorine) can be used to reduce or modify boron and/or phosphorus interstitial clusters that drive TED. In a further embodiment, substitutional carbon and/or fluorine, such as fluorine-vacancy (F-V) clusters, can prevent interstitials (such as boron or phosphorous) that drive TED. In such a case, carbon kick-out or F-V annihilation can prevent diffusion of material into the substrate.

In one implementation, first portion 121 may be formed using an epitaxial growth process. The impurities may be implanted during the epitaxial growth or after the epitaxial growth. Epitaxial growth refers to the orderly growth of a crystalline material from a substrate, where the grown material arranges itself in the same crystal orientation as the underlying substrate. In one example, epitaxial growth occurs from either one or more surfaces of cavity 120, including, for example, a {111} plane, a {110} plane, and a {100} plane. First portion 121 may be epitaxially grown using selective epitaxial growth via various methods, such as, for example, vapor-phase epitaxy (VPE), a modification of chemical vapor deposition (CVD), molecular-beam epitaxy (MBE), and/or liquid-phase epitaxy (LPE), or other applicable methods.

In another implementation, first portion 121 includes silicon germanium, and substrate 101 is a silicon substrate. In such a case, because the lattice constant, or spacing between adjacent atoms, of silicon germanium is greater than that of silicon, first portion 121 may conform to the lattice structure of substrate 101, and thereby exert a compressive stress on substrate 101.

Figure 1D:
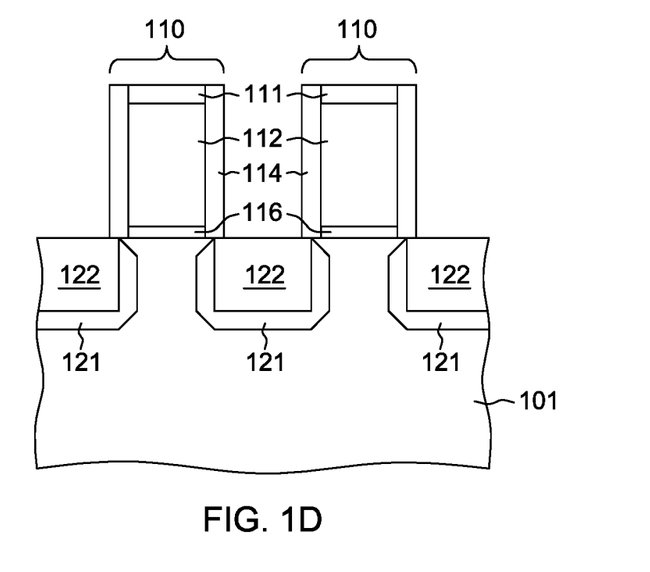
FIG. 1D is a cross-sectional elevational view of the structure of FIG. 1C after forming a second portion of the transistor structure at least partially within the cavity thereof, in accordance with one or more aspects of the present invention.

FIG. 1D is a cross-sectional elevational view of the structure of FIG. 1C after forming a second portion 122 of the transistor structure at least partially within the cavity thereof, in accordance with one or more aspects of the present invention. As illustrated, first portion 121 is disposed at least partially between substrate 101 and second portion 122. Such a configuration allows first portion 121 to inhibit diffusion of material from second portion 122 into substrate 101, and to protect substrate 101 from the processes used to form second portion 122.

By way of explanation, in one embodiment, first portion 122 and second portion 122 are, or include, one of a source region or a drain region of a field-effect transistor. For example, for a p-type transistor, source regions and drain regions are heavily doped with p-type dopants, such as boron, aluminum, or any other acceptor atoms, and for an n-type region. In another example, for an n-type transistor, source regions and drain regions are heavily doped with n-type dopants, such as phosphorous, arsenic, or any other donor atoms.

After doped source regions and drain regions have been formed, subsequent semiconductor fabrication steps may include heat treatment such as annealing. In such a case, dopants from the source regions and drain regions may diffuse into other regions of the transistor structure, such as channel regions located between the source regions and drain regions and underneath the gate structures. Advantageously, in one aspect of the present technique, first portion 121 may inhibit, block, and/or absorb diffusing dopants, preventing some or all of the dopants from reaching the other regions of the transistor structure, thereby reducing any performance variability thereof.

In addition, during the formation of second portion 122, high energy dopants, such as boron atoms, may be present. Such dopants could lead to damage to exposed portions of a substrate, such as adjacent to a channel region, diminishing the ability to introduce strain into the source regions and drain regions because of damage to the regular crystal lattice structure. Advantageously, in one embodiment, first portion 121 can inhibit strain relaxation of second portion 122 due to the doping process by protecting the substrate during the doping. For example, first portion 121 can prevent damage to the crystal lattice which could lead to strain relaxation.

In one example, forming first portion 121 and second portion 122 uses a single epitaxial growth step. This allows formation of the structure without the use of an additional mask or photolithography process. Second portion 122 can also impart a compressive stress on substrate 101, including a channel region of a transistor. For example, in one embodiment, first portion 121 and second portion 122 can include silicon germanium, and substrate 101 can be a silicon substrate. In such a case, because the lattice constant, or spacing between adjacent atoms, of silicon germanium is greater than that of silicon, second portion 121 may conform to the lattice structure of first portion 121 and, which in turn can conform to the lattice structure of substrate 101, and thereby exert a compressive stress on substrate 101. Advantageously, because first portion 121 can protect substrate 101 from damage during formation of second portion 122, strain relaxation, in which the first and/or second portions no longer conform to the lattice structure of the substrate, can be avoided.

FIGS. 2A-2D describe how the process described above for field-effect transistor fabrication can be extended for bipolar junction transistor fabrication, allowing for the formation of both types of transistors as part of an integrated scheme. For instance, in one embodiment, both types of transistors may be formed by following the techniques discussed with respect to FIGS. 1A-1D to form numerous structures, then masking (to protect from at least a portion of subsequent processing) some structures which are designed as field-effect transistors. In addition, other structures can be exposed for further processing as described below to form bipolar junction transistors. Further, a bipolar junction transistor can be formed with the first portion being a base region, the second portion being an emitter region, and the substrate being a collector region. In one embodiment, the gate structure can be removed and filled with a base contact material.

Figure 2A:
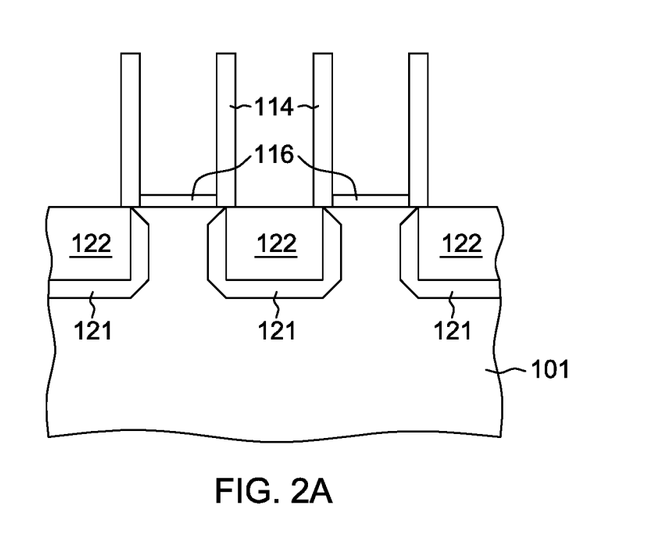
FIG. 2A is a cross-sectional elevational view of a structure obtained in a transistor structure fabrication process, in accordance with one or more aspects of the present invention.

FIG. 2A is a cross-sectional elevational view of a structure obtained in a transistor structure fabrication process, in accordance with one or more aspects of the present invention. As illustrated, by comparison with FIG. 1D, gate hard mask cap 111 and gate fill material 112 have been removed from the depicted structure.

Any suitable selective etching process with or without masking off portions of the structure may be used to remove the spacers and gate fill material. In one embodiment, an additional mask set may be used to expose only gate hard mask cap 111, and anisotropic etching can be used to remove gate fill material 112.

Figure 2B:
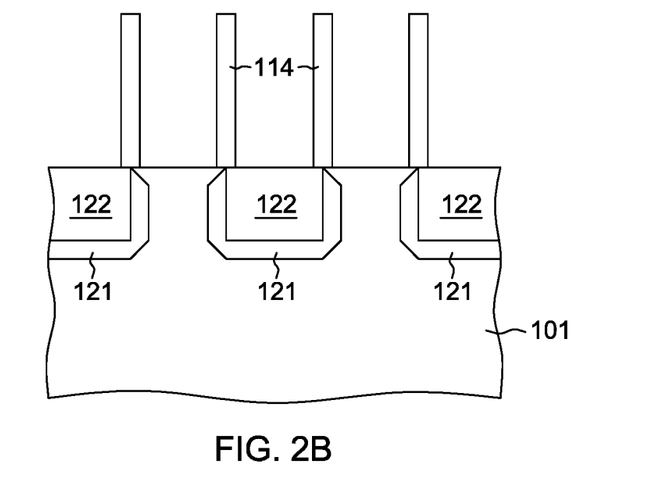
FIG. 2B is a cross-sectional elevational view of the structure of FIG. 2A after removing a gate dielectric material thereof, in accordance with one or more aspects of the present invention.

FIG. 2B is a cross-sectional elevational view of the structure of FIG. 2A after removing the gate dielectric material thereof, in accordance with one or more aspects of the present invention. Any suitable selective etching process with or without masking off portions of the structure may be used to remove the gate dielectric material.

In one embodiment, the same mask set may be used to remove the gate dielectric material as the gate fill material, either with a single etching process or multiple etching processes. In another embodiment, the gate dielectric material may not be present because it can be either removed in a prior step or never deposited in regions intended for the formation of bipolar junction transistors.

Figure 2C:
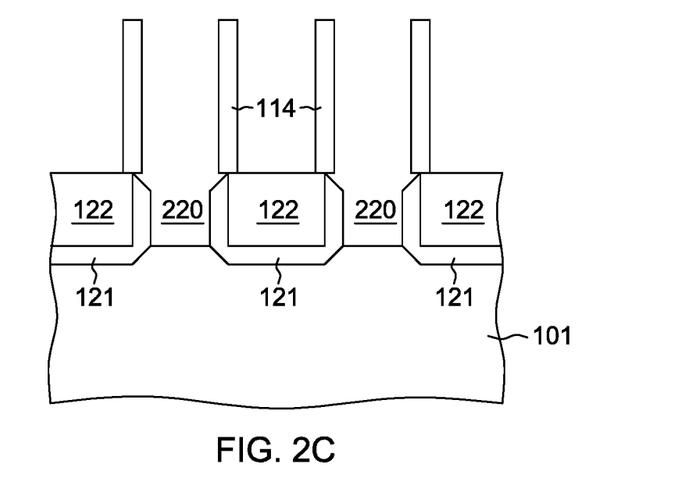
FIG. 2C is a cross-sectional elevational view of the structure of FIG. 2B after recessing a substrate thereof, in accordance with one or more aspects of the present invention.

FIG. 2C is a cross-sectional elevational view of the structure of FIG. 2B after recessing substrate 101 to form cavities 220, in accordance with one or more aspects of the present invention. Any suitable selective etching process with or without masking portions of the structure may be used to form cavities 220. In one embodiment, cavities 220 are formed to extend deep enough to expose first portions 121. In another embodiment, the cavities reveal an upper section of the first portions, for example, a section that angles inward. In another embodiment, the cavities reveal a side section of the first portions.

Figure 2D:
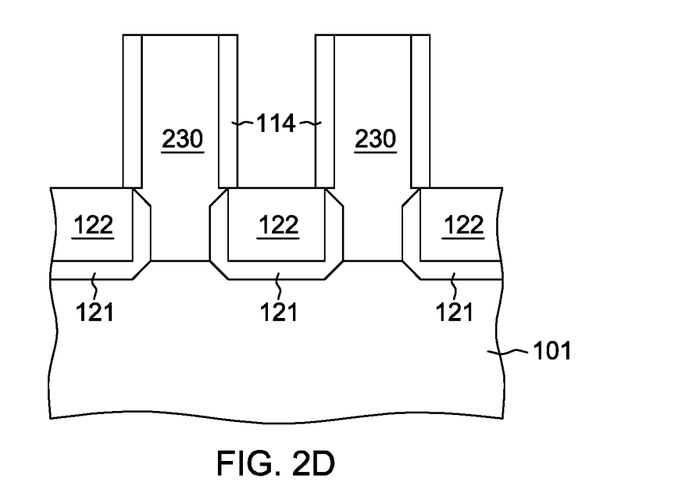
FIG. 2D is a cross-sectional elevational view of the structure of FIG. 2C after forming a base contact therein, in accordance with one or more aspects of the present invention.

FIG. 2D is a cross-sectional elevational view of the structure of FIG. 2C after forming a base contact 230 therein, in accordance with one or more aspects of the present invention. Base contact 230 may be any suitable conductive material, such as copper, tungsten, or aluminum, and may be deposited using any suitable deposition process described herein. In one embodiment, base contact 230 may be formed during fabrication processing for forming gate contacts or gate fill conductive materials for field-effect transistors also integrated on the substrate, by using the appropriate mask works.

As illustrated, a bipolar junction transistor has been formed. First portion 121 is the base portion, second portion 122 is the emitter portion, and substrate 101 is the collector portion. In such an embodiment, first portion 121 inhibits diffusion of any dopants, such as boron, from second portion 121. Advantageously, the bipolar junction transistor can be formed in the smallest critical dimension, for example, in the space used by a single field-effect transistor, and can achieve a beta in the range of 50-200. In another embodiment, the first portion can be made as thin as required by the design, in order to adjust for the required amplification factor of the bipolar junction transistor.

In one embodiment, a first portion with silicon germanium with carbon can have a conduction band edge shifted in such a manner to behave like an n-type doped semiconductor. In another embodiment, a second portion with silicon germanium, for example, with a high percentage of germanium, can have a conduction band edge shifted in such a manner to behave like a p-type doped semiconductor. In a further embodiment, the first and/or second portions may be doped with n-type or p-type dopants to further tune device performance. In one implementation, a small region between tips of adjacent first portions that make contact with the base contact can be fully depleted, isolating the base contact from the substrate, including a p-well therein (which may be a collector of the bipolar junction transistor).

Figure 3:
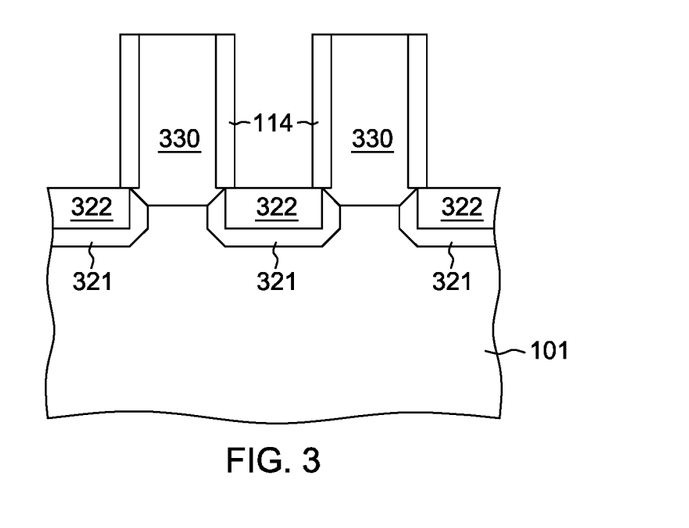
FIG. 3 is a cross-sectional elevational view of a transistor structure, in accordance with one or more aspects of the present invention.

FIG. 3 is a cross-sectional elevational view of a transistor structure, in accordance with one or more aspects of the present invention. The illustrated embodiment is an alternate bipolar junction transistor design, in which a base contact 330 extends into substrate 101 to contact a smaller portion of first portion 321. Advantageously, such a design allows for a higher performance planar bipolar junction transistor. For example, a thickness of the first portion may be tuned to be as thin as required to support an appropriate amplification factor.

In one embodiment, a first portion or second portion with high Ge percentage can shift the valence band edge toward the middle of the bandgap, and can result in the region being a p-type material. In another embodiment, the transistor structure can be a PNP or NPN structure, which may be an ideal bipolar configuration. In such a case, bipolar performance can be improved. In another embodiment, first portion 321 may have a high germanium concentration, such as 25% or higher. In further embodiments, second portion 322 may not be doped, or may be doped with carbon.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A structure comprising:
a transistor structure, the transistor structure comprising a first portion and a second portion disposed at least partially within a substrate, the first portion being disposed at least partially between the substrate and the second portion, wherein the first portion inhibits diffusion of material from the second portion into the substrate;
wherein the first portion comprises:
a base portion with a first end and a second end;
a first sidewall coupled to the first end of the base portion at a first end and positioned directly under a spacer of at least one gate structure formed on the substrate at a second end; and
a second sidewall coupled to the second end of the base portion at a first end and positioned directly under a spacer of the at least one gate structure at a second end;
wherein the first sidewall is positioned perpendicular with respect to the base portion and the second sidewall is positioned perpendicular with respect to the base portion;
wherein an exterior surface of the first portion has chamfered edges where the base portion couples to the first sidewall and an exterior surface of the second portion has chamfered edges where the base portion couples to the second sidewall; and
wherein the second end of the first sidewall has a chamfered exterior surface and the second end of the second sidewall has a chamfered exterior surface.

2. The structure of claim 1, wherein the first portion comprises first impurities and the second portion comprises second impurities, and the first impurities of the first portion inhibit diffusion of the second impurities of the second portion into the substrate.

3. The structure of claim 1, wherein the first impurities comprise one or more of carbon atoms or fluorine atoms.

4. The structure of claim 1, wherein the second impurities comprise p-type impurities.

5. The structure of claim 1, wherein the first portion and the second portion both apply stresses to the substrate.

6. The structure of claim 1, wherein the first portion and the second portion comprise one semiconductor material, and the substrate comprises another semiconductor material, the one semiconductor material and the another semiconductor material with different lattice constants.

7. The structure of claim 1, wherein the transistor structure comprises a field-effect transistor structure, and the first portion and the second portion comprise one of a source region or a drain region of the field-effect transistor structure, and the structure further comprises a channel region disposed at least partially within the substrate and adjacent to the one of a source region or a drain region thereof, wherein the first portion inhibits diffusion of the material from the second portion to the channel region.

8. The structure of claim 1, wherein the transistor structure comprises a bipolar junction transistor structure, the first portion comprising a base region and the second portion comprising an emitter portion thereof, and the structure further comprises a collector region disposed at least partially within the substrate and adjacent to the base thereof, wherein the first portion inhibits diffusion of the material from the second portion to the collector region.

9. The structure of claim 1, wherein the second portion is spaced from and does not contact the substrate or an isolation region.

10. The structure of claim 1, wherein a top surface of the first portion of the transistor structure is positioned directly below and in contact with the spacer of at least one gate structure formed on the substrate.

11. The structure of claim 1, wherein the second portion of the transistor structure is formed directly within the first portion of the transistor structure.

\* \* \* \* \*